(12) United States Patent
Chen

(10) Patent No.: US 8,107,315 B2
(45) Date of Patent: Jan. 31, 2012

(54) DOUBLE DATA RATE MEMORY DEVICE HAVING DATA SELECTION CIRCUIT AND DATA PATHS

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 204 days.

(21) Appl. No.: 12/728,601

(22) Filed: Mar. 22, 2010

(65) Prior Publication Data

US 2011/0228627 A1    Sep. 22, 2011

(51) Int. Cl.
*G11C 8/00* (2006.01)
(52) U.S. Cl. .................... 365/233.13; 365/233.1
(58) Field of Classification Search ............. 365/233.13, 365/233.1
See application file for complete search history.

(56) References Cited

U.S. PATENT DOCUMENTS

| 6,504,767 B1 | 1/2003 | Brown |
| 6,741,520 B1 | 5/2004 | Faue |
| 6,775,201 B2 * | 8/2004 | Lee et al. .................. 365/230.04 |

* cited by examiner

*Primary Examiner* — Son Dinh
*Assistant Examiner* — Nam Nguyen
(74) *Attorney, Agent, or Firm* — WPAT, P.C.; Anthony King

(57) ABSTRACT

A double data rate memory device comprises first and second sense amplifiers, a data selection circuit, and a data processing circuit. The first sense amplifier is configured to provide even data loaded on a first input and output data line, and the second sense amplifier is configured to provide odd data loaded on a second input and output data line. The data selection circuit is connected to the first and second sense amplifiers and is configured to provide output data loaded on a single data line, and the data processing circuit connected to the data selection circuit and configured to transfer the even data and the odd data in first and second data paths. The even data and the odd data are combined into the output data of the data selection circuit, and the data selection circuit selects the output data in response to a least significant bit of a column address and transfers the selected data on the single data line in response to a clock signal.

18 Claims, 9 Drawing Sheets

DOUBLE DATA RATE MEMORY DEVICE HAVING DATA SELECTION CIRCUIT AND DATA PATHS

BACKGROUND OF THE INVENTION

1. Field of the Invention

The present invention relates to a double data rate memory device, and more particularly, to a double data rate memory device having a data selection circuit and different input/output (I/O) data paths.

2. Description of the Related Art

Generally, a delay locked loop (DLL) circuit is used in a synchronous semiconductor memory device, such as a double data rate synchronous dynamic random access memory (DDR SDRAM), to perform synchronization between an internal clock signal and an external clock signal of the synchronous semiconductor memory device. When the external clock signal is connected to the synchronous semiconductor memory device, a time delay occurs due to a clock skew between the external clock signal and the internal clock signal. Therefore, the DLL circuit is employed in the synchronous semiconductor memory device for generating the synchronized internal clock signal by compensating the clock skew.

FIG. 1 shows a block diagram of a typical analog DLL circuit 10. The analog DLL circuit 10 includes a delay line 12 including a plurality of delay cells. A phase detector 16 receives an external clock signal ECLK and an output clock signal DQS and detects the phase difference between the two clock signals ECLK and DQS. A charge pump circuit 18 provides a control voltage VC to vary the delay time of the delay line 12 according to the comparison result of the phase detector 16. A logic circuit 14 generates pulse signals $Z_1$ and $Z_2$ prior to rising and falling edges of a clock signal from the delay line 12. As such, the DLL circuit 10 generates and outputs the internal clock signal DQS delayed from the external signal ECLK to the DDR SDRAM, and the DDR SDRAM processes I/O data (also referred to as DQ signals) using both rising and falling edges of the clock signal DQS, which functions as a data strobe to control the timing of data transfer.

FIG. 2 shows a simplified block diagram of a memory device 200. The memory device 200 includes a memory cell array 202. The memory cell array 202 typically includes a dynamic random access memory (DRAM) which includes a plurality of memory cells arranged in a matrix. A row decoder 204 and a column decoder 206 access individual memory cells in the matrix in response to an address, provided on an address bus. Multiple input circuits 210-212 and multiple output circuits 214-216 connected to data buses 218 0-N transfer bi-directional data to the memory cell array 202. Each of the data buses 218 0-N provides a plurality of bits of data $D_0$-$D_N$. In addition, a clock generator 208, including the aforementioned DLL circuit, generates various clock signals for controlling the timing of the memory device 200.

As shown in FIG. 2, the memory device 200 includes the plurality of data buses 218 0-N for data communication with the memory cell array 202. FIG. 3 shows a data transfer mechanism between a main memory and a data bus disclosed in U.S. Pat. No. 6,504,767. Referring to FIG. 3, the data bus includes a first output path 302 and a second output path 304. Each of the data paths transfers first and second data bits from a main memory to a data pad DQ0 in one clock cycle during a read operation. In the first output path 302, data transferred to a latch node A is controlled by MUX 320 and MUX 322, which receive clock signals CLKA and CLKB, respectively. In the second output path 304, data transferred to a latch node B is controlled by MUX 324 and MUX 326, which also receive clock signals CLKA and CLKB, respectively. In this case, the clock signals CLKA and CLKB are activated according to the initial address of a column of the main memory. Because each data bus requires two output paths for transmitting data based on the address of the column, the wire routing in this configuration is extensive and complex.

Therefore, there is a need to provide a double data rate memory device with fewer data paths for transferring data during a read and write operation. Specifically, the double data rate memory device has a data selection circuit for reducing the number of data lines and has two data paths connected to the data selection circuit for transferring the data.

SUMMARY OF THE INVENTION

An aspect of the present invention is to provide a double data rate memory device having a data selection circuit and different data paths.

According to one embodiment of the present invention, the double data rate memory device comprises first and second sense amplifiers, a data selection circuit, and a data processing circuit. The first sense amplifier is configured to provide even data loaded on a first input and output data line, and the second sense amplifier is configured to provide odd data loaded on a second input and output data line. The data selection circuit is connected to the first and second sense amplifiers and is configured to provide output data loaded on a single data line. The data processing circuit is connected to the data selection circuit and configured to transfer the even data and the odd data in first and second data paths. The even data and the odd data are combined into the output data of the data selection circuit, and the data selection circuit selects the output data in response to a least significant bit of a column address and transfers the selected data on the single data line in response to a clock signal.

Another aspect of the present invention is to provide a system including a double data rate memory device.

According to one embodiment of the present invention, the system comprises a processor and a double data rate memory device connected to the processor. The double data rate memory device comprises first and second sense amplifiers, a data selection circuit, and a data processing circuit. The first sense amplifier is configured to provide even data loaded on a first input and output data line, and the second sense amplifier is configured to provide odd data loaded on a second input and output data line. The data selection circuit is connected to the first and second sense amplifiers and is configured to provide output data loaded on a single data line. The data processing circuit is connected to the data selection circuit and configured to transfer the even data and the odd data in the first and second data paths. The even data and the odd data are combined into the output data of the data selection circuit, and the data selection circuit selects the output data in response to a least significant bit of a column address and transfers the selected data on the single data line in response to a clock signal.

BRIEF DESCRIPTION OF THE DRAWINGS

The invention will be described according to the appended drawings in which.

DETAILED DESCRIPTION OF THE INVENTION

Figure 1:
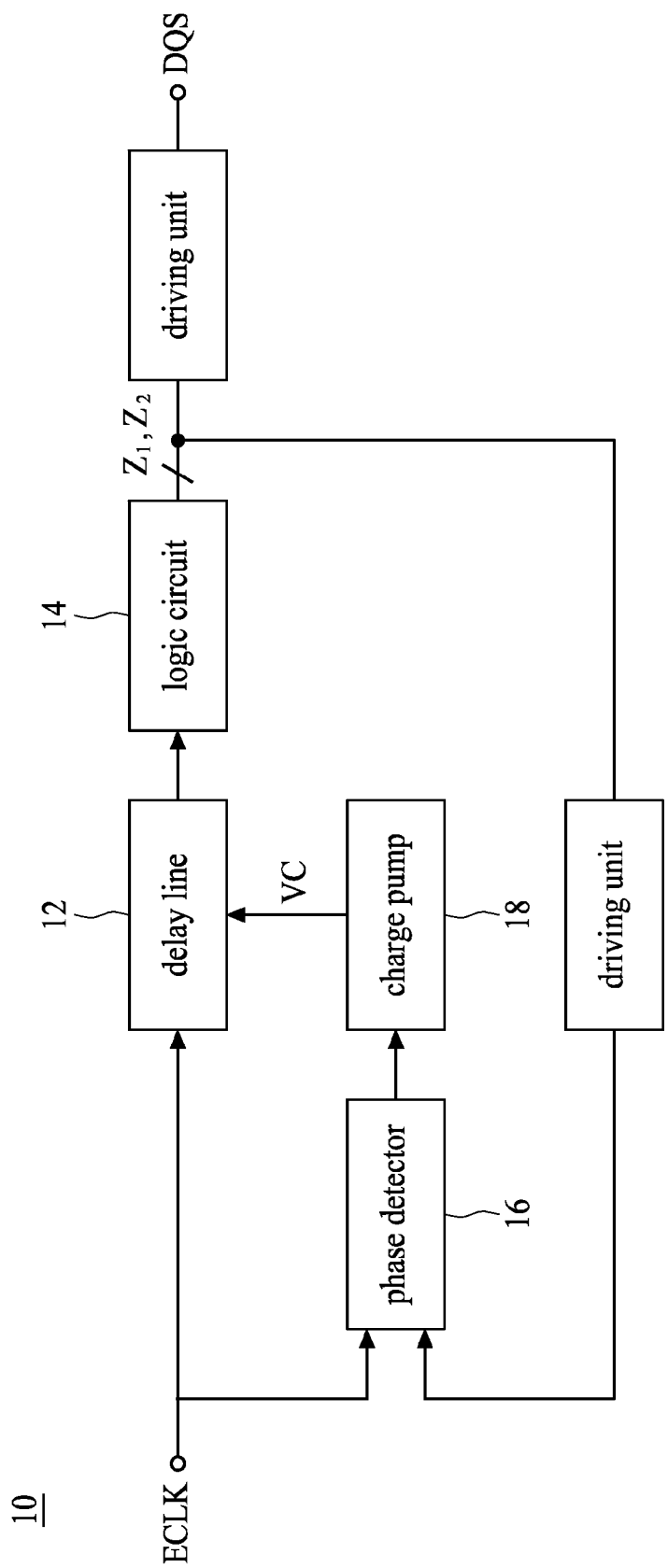
FIG. 1 shows a block diagram of a typical analog DLL circuit.
Figure 2:
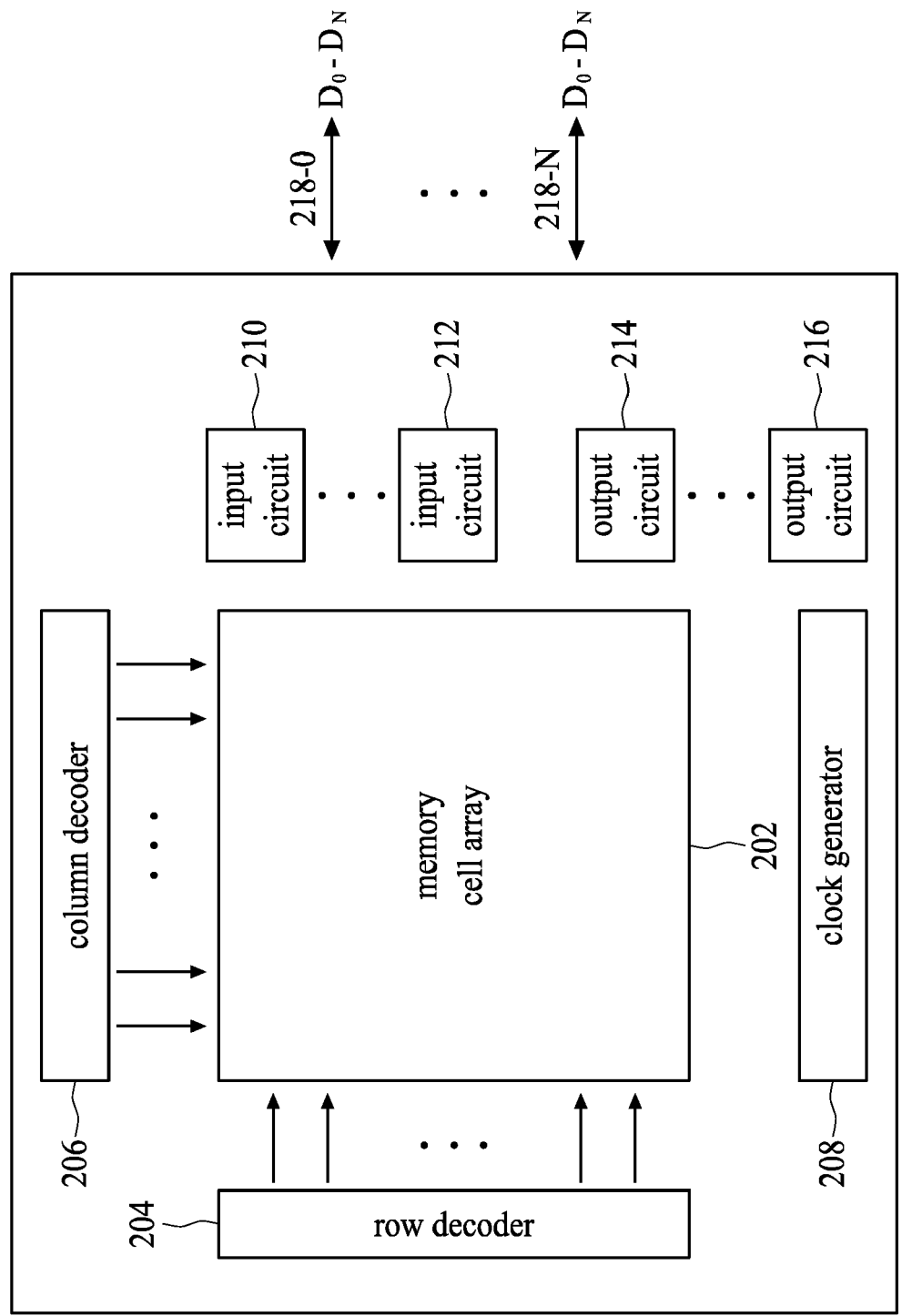
FIG. 2 shows a simplified block diagram of a memory device.
Figure 3:
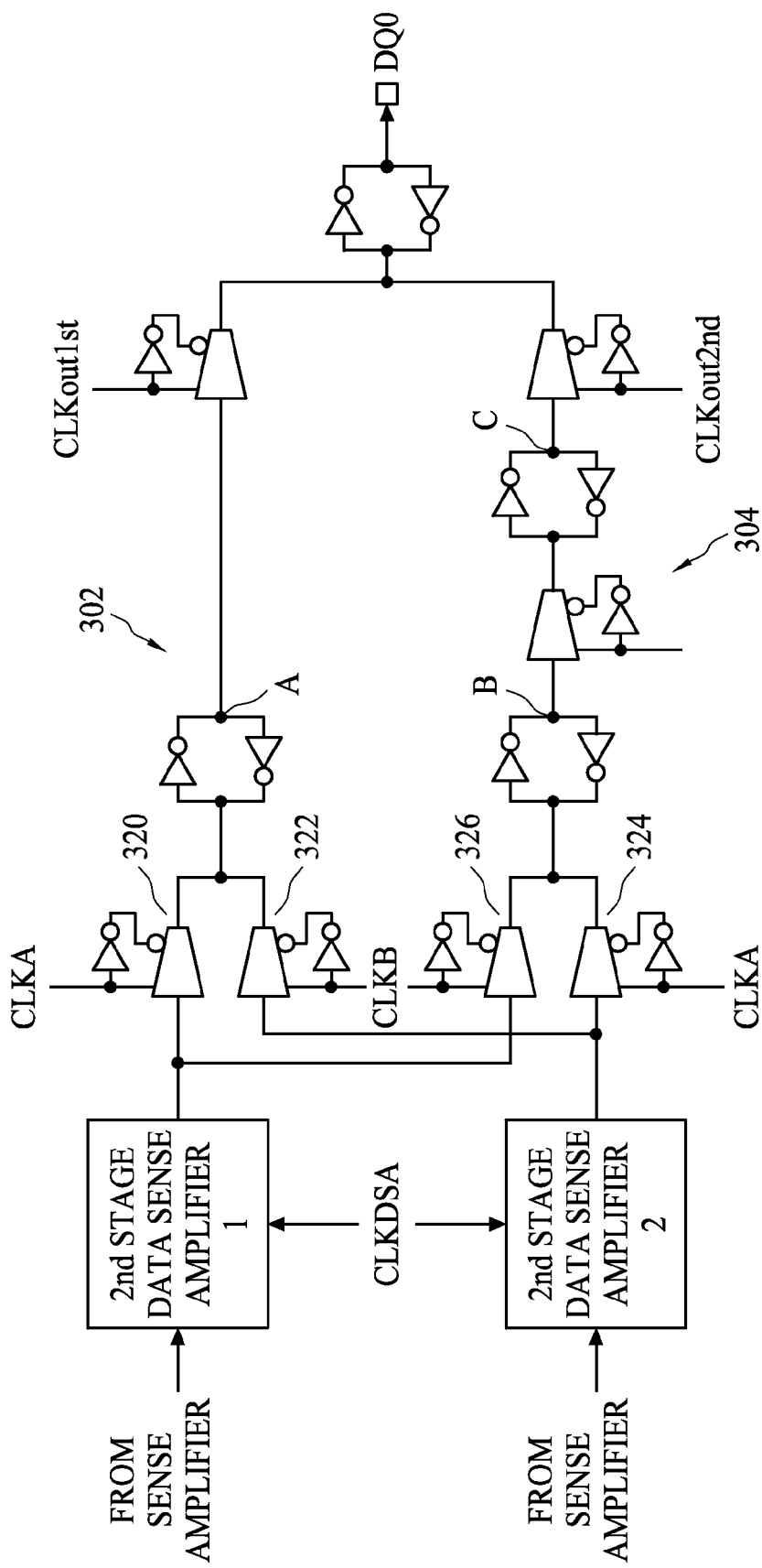
FIG. 3 shows a data transfer mechanism between a main memory and a data bus disclosed in U.S. Pat. No. 6,504,767.
Figure 4:
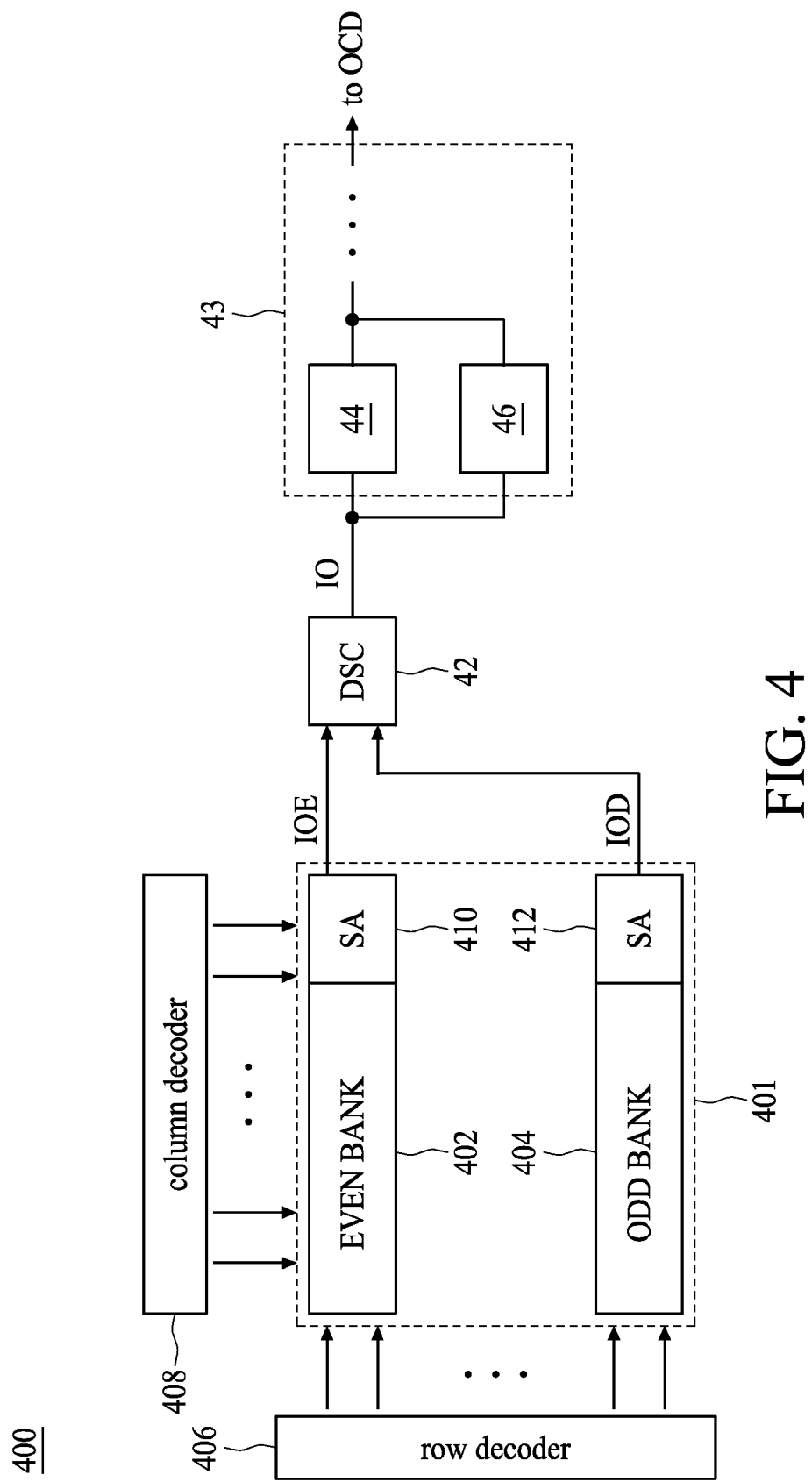
FIG. 4 shows a block diagram of a double data rate memory device according to one embodiment of the present invention.

FIG. 4 shows a block diagram of a double data rate memory device 400 according to one embodiment of the present invention. The memory device 400 comprises a main memory 401 including an even bank 402 and an odd bank 404. Each memory cell of the even and odd banks 402 and 404 is accessed by a row address and a column address decoded by a row decoder 406 and a column decoder 408, respectively, to write data to or read data from the even and odd banks 402 and 404. The read data from the even bank 402 is amplified by a first sense amplifier SA 410, and the amplified data is loaded on an even input and output line IOE. Similarly, the read data from the odd bank 404 is amplified by a second sense amplifier SA 412, and the amplified data is placed on an odd input and output line IOD.

A data selection circuit DSC 42 is electrically coupled to the even and odd input and output lines IOE and IOD, as shown in FIG. 4. The DSC 42 selects either the even data loaded on the line IOE or the odd data loaded on the line IOD in response to a value of the least significant bit (LSB) of the column address, and outputs the selected data on a data line IO in response to a clock signal. A data processing circuit 43 is electrically coupled to the data line IO, wherein the circuit 43 comprises a first data path 44 and a second data path 46.

Figure 5:
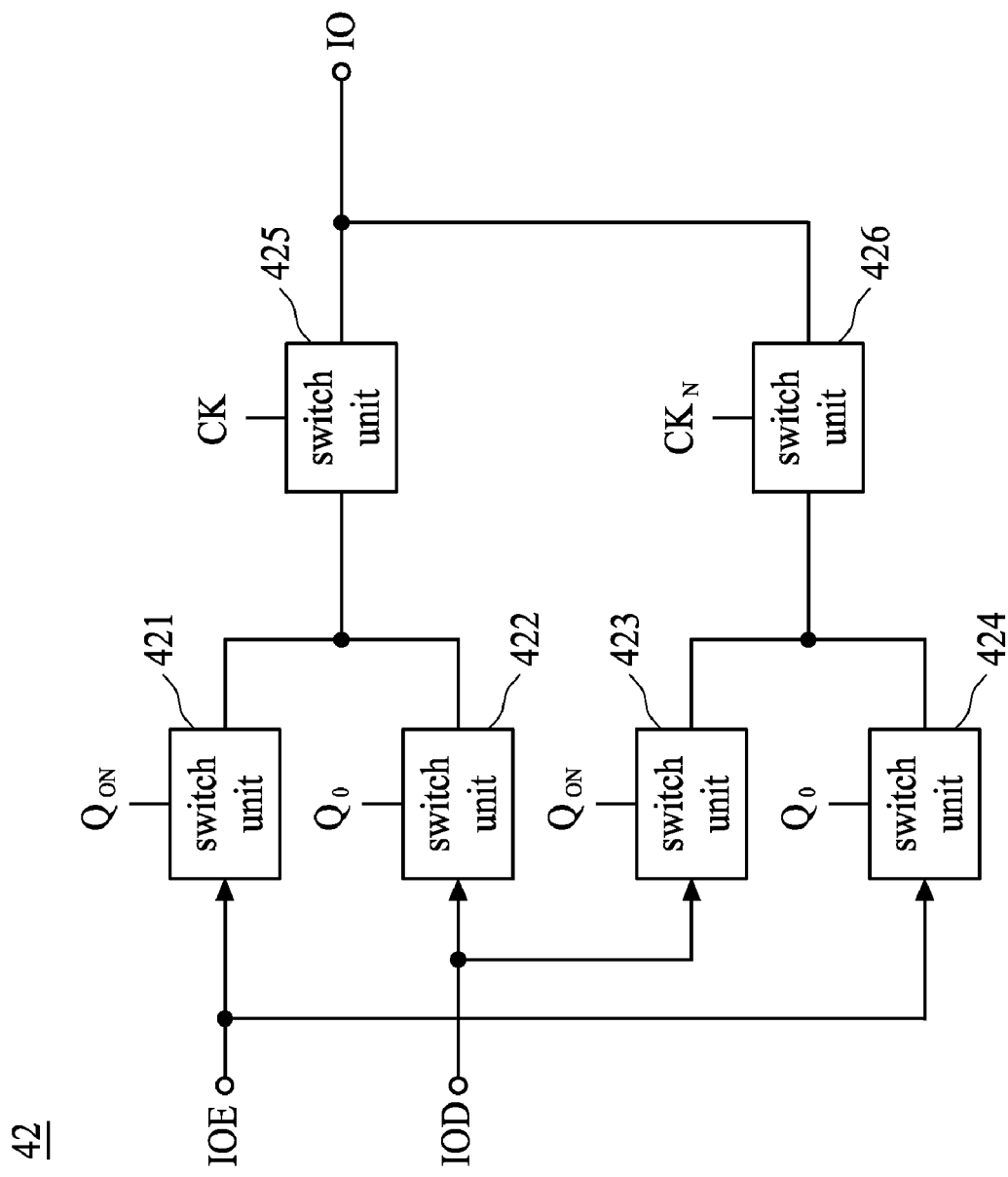
FIG. 5 shows a detailed block diagram in accordance with one embodiment of the data selection circuit in FIG. 4.

FIG. 5 shows a detailed block diagram in accordance with one embodiment of the data selection circuit DSC 42 in FIG. 4. The DSC 42 comprises switch units 421-426. The switch units 421 and 424 receive the even data loaded on the even input and output line IOE, and the switch units 422 and 423 receive the odd data loaded on the odd input and output line IOD. In addition, the switch units 421-424 are operative in response to complementary control signals $Q_0$ and $Q_{0N}$. Here, the control signal $Q_0$ represents the value of the LSB of the column address. If the control signal $Q_0$ is at a logic low level and the control signal $Q_{0N}$ is at a logic high level, the even data is transferred to the switch unit 425 through the switch unit 421, and the odd data is transferred to the switch unit 426 through the switch unit 423. Alternatively, if the control signal $Q_0$ is at a logic high level and the control signal $Q_{0N}$ is at a logic low level, the odd data is transferred to the switch unit 425 through the switch unit 422, and the even data is transferred to the switch unit 426 through the switch unit 424. After receiving the even or the odd data, the switch units 425 and 426 output data loaded on the data line IO to the data processing circuit 43 in response to complementary clock signals CK and $CK_N$. For example, if the control signal $Q_0$ is at a logic low level, then the even data is loaded on the data line IO during a positive half cycle of the CK signal, and the odd data is loaded on the data line IO during a negative half cycle of the CK signal.

Figure 6:
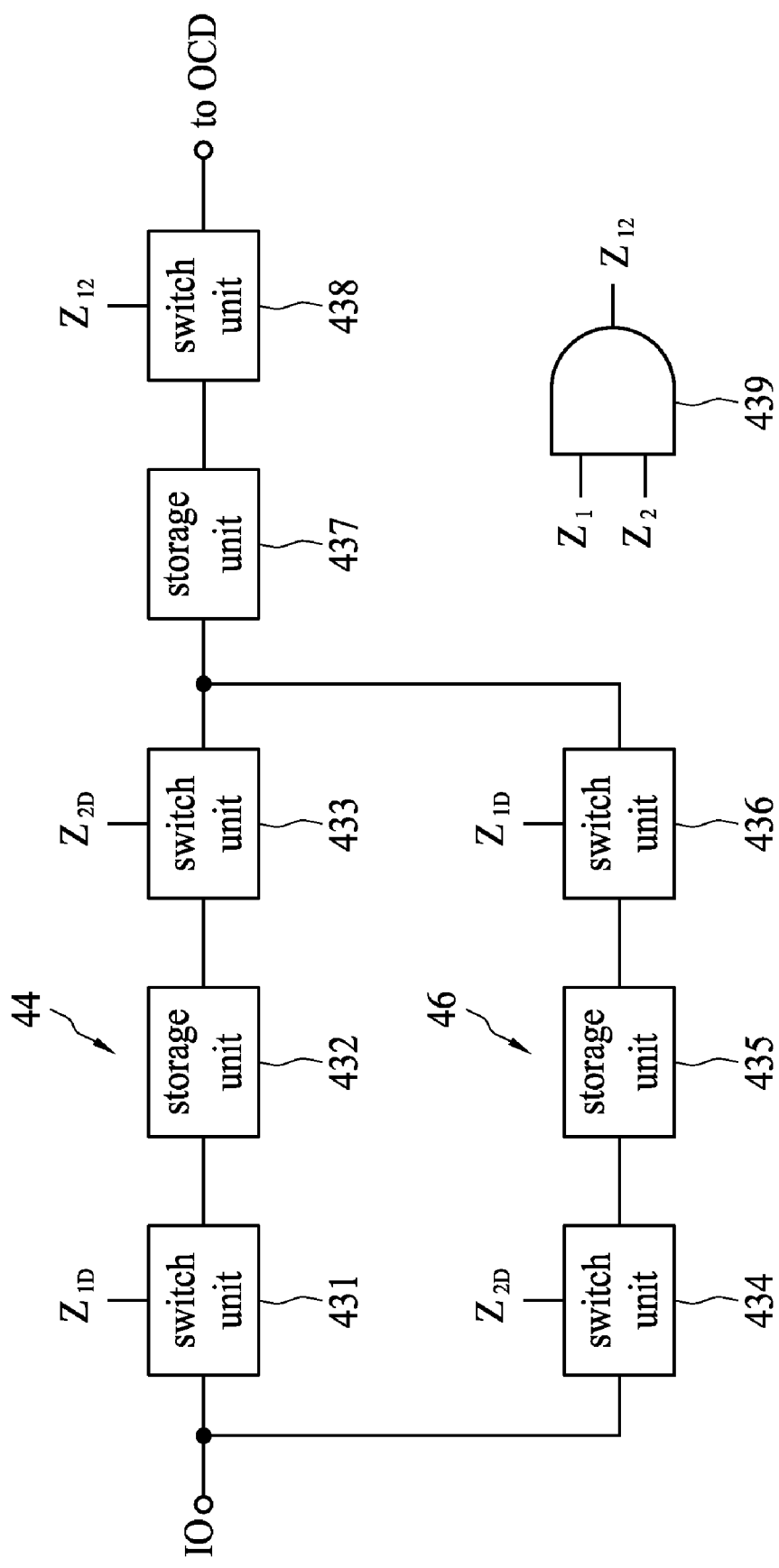
FIG. 6 shows a schematic diagram in accordance with one embodiment of the data processing circuit in FIG. 4.

FIG. 6 shows a schematic diagram in accordance with one embodiment of the data processing circuit 43 in FIG. 4, wherein the data processing circuit 43 comprises the first data path 44 and the second data path 46. The first data path 44 transfers the data loaded on the data line IO to a storage unit 437 through a switch unit 431, a storage unit 432, and a switch unit 433, while the second data path 46 transfers the data loaded on the data line IO to the storage unit 437 through a switch unit 434, a storage unit 435, and a switch unit 436. In the first data path 44, the data transferred to the storage unit 437 is controlled by the switch units 431 and 433, which receive control signals $Z_{1D}$ and $Z_{2D}$, respectively. In the second data path 46, the data transferred to the storage unit 437 is controlled by the switch units 434 and 436, which receive control signals $Z_{2D}$ and $Z_{1D}$, respectively. In addition, data provided to an off-chip driver OCD is controlled by a switch unit 438, which receives a control signal $Z_{12}$. The switch unit 438 is operative when the control signal $Z_{12}$ is activated where one of the signals $Z_1$ and $Z_2$ is at a logic high level. The switch units in FIG. 6 can be, but are not limited to, an NMOS transistor or a transmission gate composed of a PMOS transistor and an NMOS transistor, and the storage unit can be, but is not limited to, a latch circuit.

Figure 7:
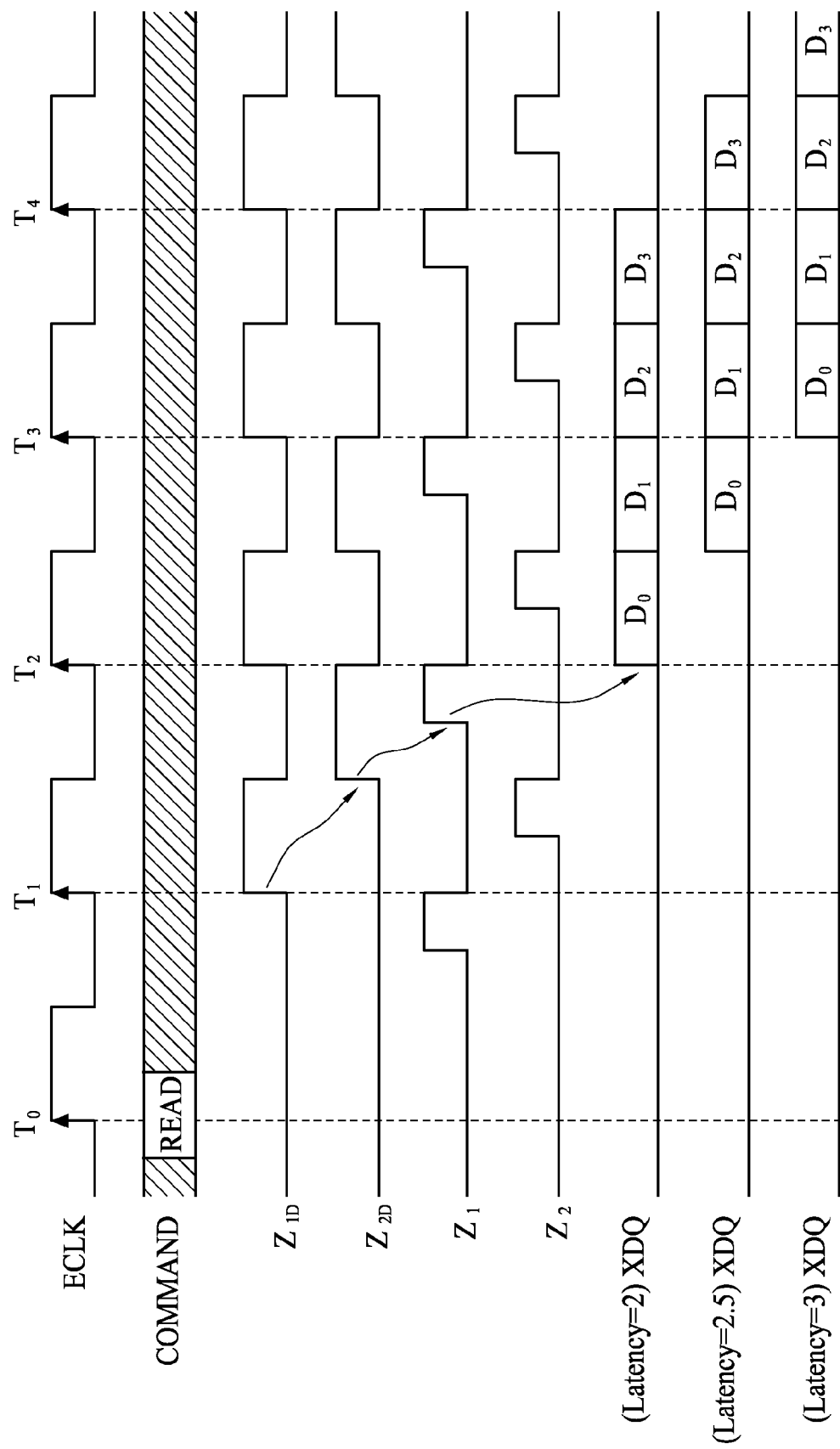
FIG. 7 shows a timing diagram of FIG. 6 during a memory device operation at various latency settings.

FIG. 7 shows a timing diagram of FIG. 6 during a memory device operation at various latency settings. For simplicity, only four bits of data ($D_0$-$D_3$) from the main memory 401 are assumed to be outputted to the OCD. As shown in FIG. 7, ECLK represents the external clock signal applied to the memory device 400 in FIG. 4. COMMAND represents a command applied to the memory device 400 to perform certain memory operations such as a read operation. $Z_{1D}$, $Z_{2D}$, $Z_1$, and $Z_3$ represent control signals applied to switch units 431, 433, 434, 436, and 438 in FIG. 6. XDQ represents output data $D_0$-$D_3$ provided to the OCD in FIG. 6. Each of the data XDQ in FIG. 7 represents output data $D_0$-$D_3$ at a different latency setting, and the different latency settings provide different timing for when a first bit of data $D_0$ is available at one of the data lines coupled to the OCD after a read command is issued.

For example, if the latency is set at two, a first bit of data $D_0$ is output to the data line within two clock cycles after the READ command. As shown in FIG. 7, the READ command is issued at time $T_0$, and the first bit of data $D_0$ of output data XDQ is available at time $T_2$, which is two clock cycles after the READ command. Similarly, if the latency is set at 2.5 or 3, the first bit of the data $D_0$ is available at $T_{2.5}$ or $T_3$, which represent 2.5 or three clock cycles, respectively, after the READ command.

The timing diagram in FIG. 7 is described below in further detail. During a read operation, the data is subsequently transferred at a rate of two data bits for every clock cycle. If the value of the LSB of the column address is set at a logic low level, then the switch units 421 and 423 in FIG. 5 are operative. Therefore, at time $T_1$, the even data loaded on the data line IO is available when the signal ECLK transitions to HIGH, and the odd data loaded on the data line IO is available when the signal ECLK transitions to LOW. As such, the signal $Z_{1D}$ transitions to HIGH to activate the switch unit 431, allowing the data to pass through the switch unit 431 to the storage unit 432. Subsequently, the signal $Z_{2D}$ transitions to HIGH to activate the switch unit 433, allowing the data to pass through the switch unit 433 to the storage unit 437. Because the signal $Z_1$ is a pulse signal occurring immediately prior to a rising edge of the signal ECLK and the signal $Z_{12}$ transitions to HIGH when either $Z_1$ or $Z_2$ transitions to HIGH, the first bit of data $D_0$ is available at time $T_2$.

Similarly, the odd data loaded on the data line IO is available after time $T_1$ when the signal ECLK transitions to LOW. Subsequently, the signal $Z_{2D}$ transitions to HIGH to activate the switch unit 434, allowing the data to pass through the switch unit 434 to the storage unit 435. Next, the signal $Z_{1D}$ transitions to HIGH to activate the switch unit 436, allowing the data to pass through the switch unit 436 to the storage unit 437. Because the signal $Z_2$ is a pulse signal occurring immediately prior to a falling edge of the signal ECLK and the signal $Z_{12}$ transitions to HIGH when either $Z_1$ or $Z_2$ transitions to HIGH, the second bit of data $D_1$ is available on a negative clock half cycle after time $T_2$. Thus, within two clock cycles, four data bits $D_0$-$D_3$ are output to the off-chip driver, with two bits for each cycle.

Alternatively, if the value of the LSB of the column address is set at a logic high level, then the switch units 422 and 423 in FIG. 5 are operative. Therefore, at time $T_1$, the odd data loaded on the data line IO is available when the signal ECLK transitions to HIGH, and the even data loaded on the data line IO is available when the signal ECLK transitions to LOW. Accordingly, the signals $Z_{1D}$, $Z_{2D}$, and $Z_{12}$ are activated subsequently so as to transfer the odd data to the OCD, and the signals $Z_{2D}$, $Z_{1D}$, and $Z_{12}$ are activated subsequently so as to transfer the even data to the OCD.

Figure 8:
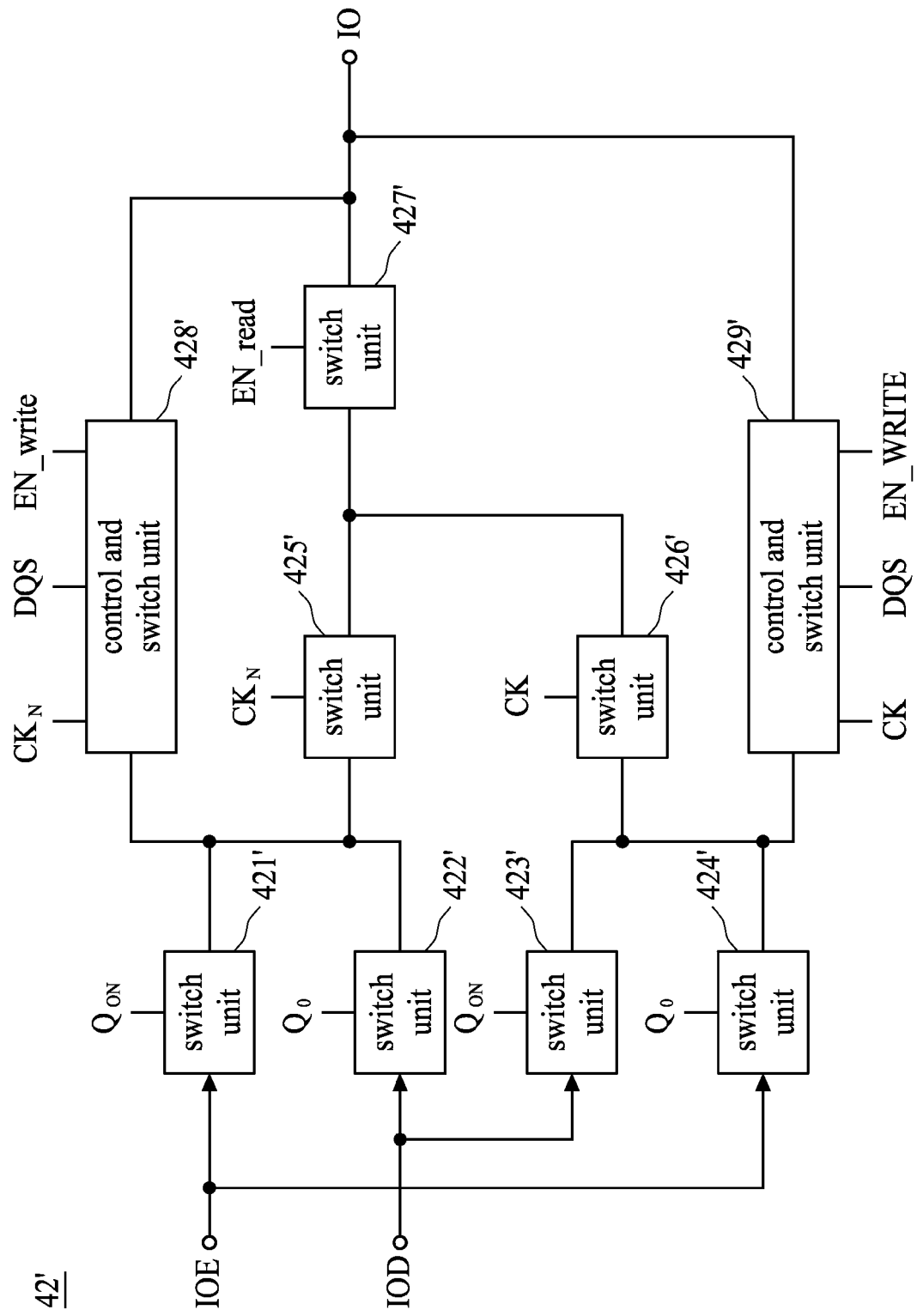
FIG. 8 shows a modified data selection circuit while the memory device performs the write operation.

The memory device 400 may perform both write and read operations, and FIG. 8 shows a modified data selection circuit 42' while the memory device 400 performs the write operation. The circuit 42' further comprises a switch unit 427' and control and switch units 428', 429'. The switch unit 427' is operative in response to a control signal EN_read, which is activated when the memory device 400 operates in the read operation. The control and switch units 428', 429' are operative in response to a control signal EN_write, which is activated when the memory device 400 operates in the write operation.

Figure 9:
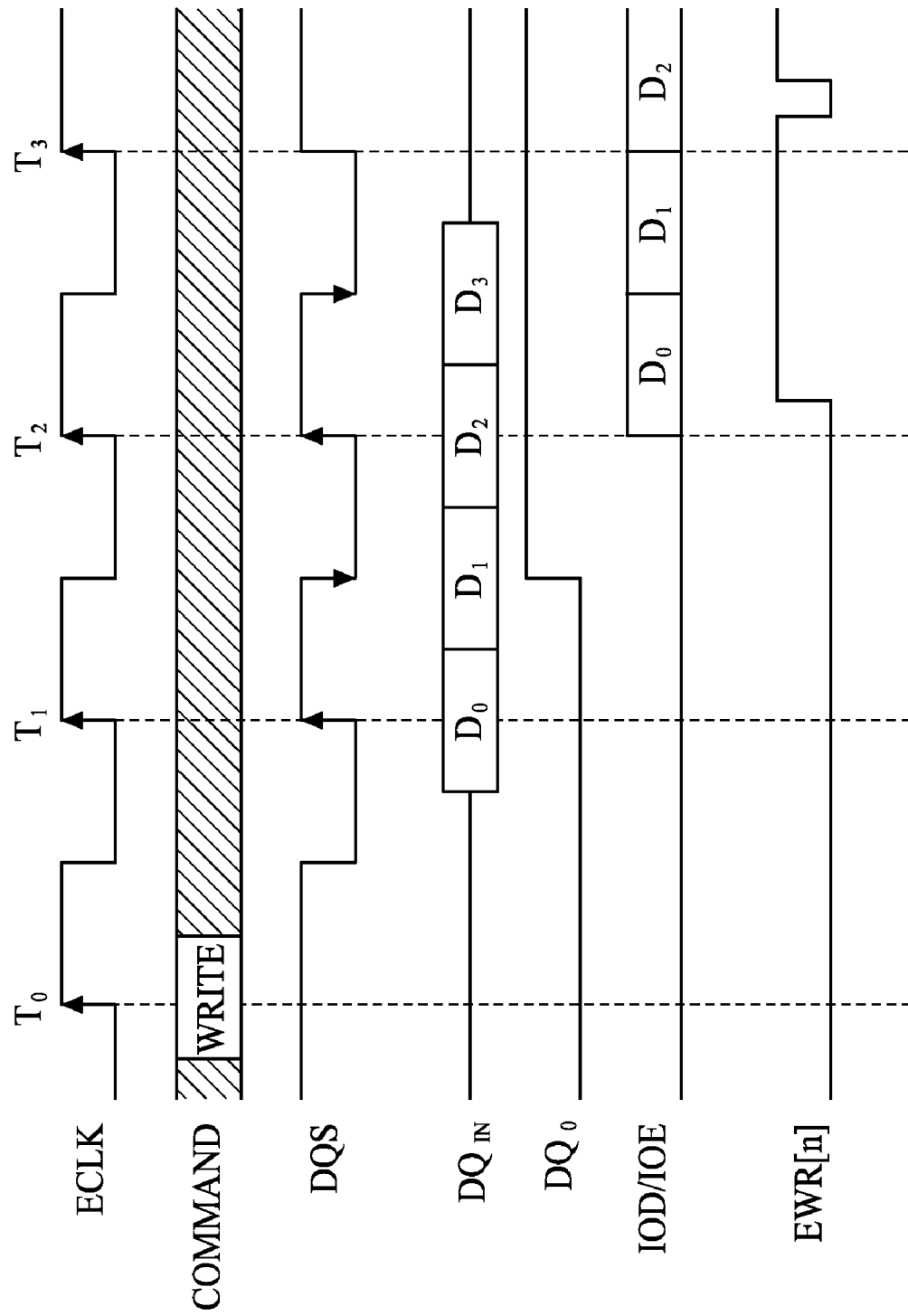
FIG. 9 is a timing diagram illustrating the write operation of the double data rate memory device in accordance with one embodiment of the present invention.

FIG. 9 is a timing diagram illustrating the write operation of the double data rate memory device in accordance with one embodiment of the present invention. For simplicity, only four bits of data ($D_0$-$D_3$) from the data line IO are assumed to be written to the main memory 401. As shown in FIG. 9, when a write command WRITE is issued, a plurality of periodic pulses occurs in a data strobe signal DQS after the signal DQS enters a logic low level, and the following periodic pulses of the signal DQS are in synchronization with the external clock ECLK. The rising and falling edges of these periodic pulses are used for writing data $D_0$, $D_1$, $D_2$, and $D_3$ into memory cells of the main memory 401. If the control signal $Q_0$ is set at a logic high level, as shown in FIG. 9, the odd data loaded on the line IOD will include the first bit of data $D_0$ and the third bit of data $D_2$, and the even data loaded on the line IOE will include the second bit of data $D_1$ and the fourth bit of data $D_3$. Alternatively, if the control signal $Q_0$ is set at a logic low level, the even data loaded on the line IOE will include the first bit of data $D_0$ and the third bit of data $D_2$, and the odd data loaded on the line IOD will include the second bit of data $D_1$ and the fourth bit of data $D_3$. A signal EWR[n] is activated to transfer two data bits at a time for writing data to the main memory 401.

The above-described embodiments of the present invention are intended to be illustrative only. Numerous alternative embodiments may be devised by those skilled in the art without departing from the scope of the following claims.

What is claimed is:

1. A double data rate memory device comprising:
   a first sense amplifier configured to provide even data loaded on a first input and output data line;
   a second sense amplifier configured to provide odd data loaded on a second input and output data line;
   a data selection circuit connected to the first and second sense amplifiers and configured to provide output data loaded on a single data line; and
   a data processing circuit connected to the data selection circuit and configured to transfer the even data and the odd data in first and second data paths;
   wherein the even data and the odd data are combined into the output data of the data selection circuit and the data selection circuit selects the output data in response to a least significant bit of the column address and transfers the selected data on the single data line in response to a clock signal.

2. The double data rate memory device of claim 1, wherein the memory device further comprises first and second memory banks connected to the first and second sense amplifiers.

3. The double data rate memory device of claim 1, wherein the data selection circuit comprises:
   a first switch unit connected to the first sense amplifier for providing an output signal in response to a complementary least significant bit of the column address;
   a second switch unit connected to the second sense amplifier for providing an output signal in response to the least significant bit of the column address;
   a third switch unit connected to the second sense amplifier for providing an output signal in response to the complementary least significant bit of the column address; and
   a fourth switch unit connected to the first sense amplifier for providing an output signal in response to the least significant bit of the column address.

4. The double data rate memory device of claim 3, wherein the data selection circuit further comprises:
   a fifth switch unit connected to the first and second switch units for providing an output signal in response to the clock signal; and
   a sixth switch unit connected to the third and fourth switch units for providing an output signal in response to a complementary clock signal.

5. The double data rate memory device of claim 1, wherein the first data path comprises:
   a first switch unit configured to generate an output signal in response to a first control signal;
   a first storage unit connected to the first switch unit; and
   a second switch unit connected to the first storage unit for generating an output signal in response to a second control signal;
   wherein the first control signal is a pulse signal occurring immediately after a rising edge of the clock signal, and the second control signal is a pulse signal occurring immediately after a falling edge of the clock signal.

6. The double data rate memory device of claim 5, wherein the second data path comprises:
   a third switch unit configured to generate an output signal in response to the second control signal;
   a second storage unit connected to the third switch unit; and
   a fourth switch unit connected to the second storage unit for generating an output signal in response to the first control signal.

7. The double data rate memory device of claim 6, wherein the data processing circuit further comprises:
   a third storage unit connected to the second and the fourth switch units; and
   a fifth switch unit connected to the third storage unit for generating an output signal in response to a third control signal;

wherein the third control signal is a pulse signal occurring immediately prior to the rising edge and the falling edge of the clock signal.

8. The double data rate memory device of claim 1, wherein the data selection circuit further comprises a switch unit operative when the memory devices performs a read operation, and comprises first and second control and switch units operative when the memory device performs a write operation.

9. The double data rate memory device of claim 8, wherein the first and second control and switch units are configured to generate output signals in response to the clock signal and a data strobe signal.

10. A system comprising:
a processor; and
a double data rate memory device connected to the processor, the double data rate memory device comprising:
   a first sense amplifier configured to provide even data loaded on a first input and output data line;
   a second sense amplifier configured to provide odd data loaded on a second input and output data line;
   a data selection circuit connected to the first and second sense amplifiers and configured to provide output data loaded on a single data line; and
   a data processing circuit connected to the data selection circuit and configured to transfer the even data and the odd data in first and second data paths;
   wherein the even data and the odd data are combined into the output data of the data selection circuit and the data selection circuit selects the output data in response to a least significant bit of column address and transfers the selected data on the single data line in response to a clock signal.

11. The system of claim 10, wherein the memory device further comprises first and second memory banks connected to the first and second sense amplifiers.

12. The system of claim 10, wherein the data selection circuit comprises:
a first switch unit connected to the first sense amplifier for providing an output signal in response to a complementary least significant bit of the column address;
a second switch unit connected to the second sense amplifier for providing an output signal in response to the least significant bit of the column address;
a third switch unit connected to the second sense amplifier for providing an output signal in response to the complementary least significant bit of the column address; and
a fourth switch unit connected to the first sense amplifier for providing an output signal in response to the least significant bit of the column address.

13. The system of claim 12, wherein the data selection circuit further comprises:
a fifth switch unit connected to the first and second switch units for providing an output signal in response to the clock signal; and
a sixth switch unit connected to the third and fourth switch units for providing an output signal in response to a complementary clock signal.

14. The system of claim 10, wherein the first data path comprises:
a first switch unit configured to generate an output signal in response to a first control signal;
a first storage unit connected to the first switch unit; and
a second switch unit connected to the first storage unit for generating an output signal in response to a second control signal;
wherein the first control signal is a pulse signal occurring immediately after a rising edge of the clock signal, and the second control signal is a pulse signal occurring immediately after a falling edge of the clock signal.

15. The system of claim 14, wherein the second data path comprises:
a third switch unit configured to generate an output signal in response to the second control signal;
a second storage unit connected to the third switch unit; and
a fourth switch unit connected to the second storage unit for generating an output signal in response to the first control signal.

16. The system of claim 15, wherein the data processing circuit further comprises:
a third storage unit connected to the second and the fourth switch units; and
a fifth switch unit connected to the third storage unit for generating an output signal in response to a third control signal;
wherein the third control signal is a pulse signal occurring immediately prior to the rising edge and the falling edge of the clock signal.

17. The system of claim 10, wherein the data selection circuit further comprises a switch unit operative when the memory devices performs a read operation, and comprises first and second control and switch units operative when the memory device performs a write operation.

18. The system of claim 17, wherein the first and second control and switch units are configured to generate output signals in response to the clock signal and a data strobe signal.

* * * * *